(12) United States Patent
Takase

(10) Patent No.: US 7,863,751 B2
(45) Date of Patent: Jan. 4, 2011

(54) MULTILAYER WIRING STRUCTURE FOR MEMORY CIRCUIT

(75) Inventor: Satoru Takase, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 128 days.

(21) Appl. No.: 12/171,650

(22) Filed: Jul. 11, 2008

(65) Prior Publication Data
US 2009/0020785 A1    Jan. 22, 2009

(30) Foreign Application Priority Data
Jul. 18, 2007    (JP) .............................. 2007-186977

(51) Int. Cl.
*H01L 29/40*    (2006.01)
(52) U.S. Cl. .................. 257/774; 257/775; 257/784; 257/E23.02; 257/E23.144; 438/667
(58) Field of Classification Search .............. 257/784, 257/E23.02, E23.144, 774, 775; 438/667
See application file for complete search history.

(56) References Cited

U.S. PATENT DOCUMENTS

| | | | |
|---|---|---|---|
| 5,831,219 A | 11/1998 | Kobayashi et al. | |
| 6,876,565 B2 | 4/2005 | Meguro et al. | |
| 7,038,280 B2 * | 5/2006 | Righter | 257/355 |
| 2006/0141679 A1 | 6/2006 | Subramanian et al. | |
| 2006/0264040 A1 | 11/2006 | Takada et al. | |
| 2006/0268594 A1 | 11/2006 | Toda | |
| 2007/0195590 A1* | 8/2007 | Sugita | 365/163 |

FOREIGN PATENT DOCUMENTS

WO    WO 03/085675 A3    10/2003
WO    WO 2004/084229 A1    9/2004

OTHER PUBLICATIONS

U.S. Appl. No. 12/718,374, filed Mar. 5, 2010, Okukawa et al.

* cited by examiner

*Primary Examiner*—Wael M Fahmy
*Assistant Examiner*—John C Ingham
(74) *Attorney, Agent, or Firm*—Oblon, Spivak, McClelland, Maier & Neustadt, L.L.P.

(57) ABSTRACT

A semiconductor integrated circuit device includes: a semiconductor substrate, on which diffusion layers are formed; and multilayered wirings stacked above the semiconductor substrate to be connected to the diffusion layers via contact plugs, wherein a first wring and a second wiring formed thereabove are connected to the diffusion layers via first contact plug(s) and second contact plugs, respectively, and the number of the second contact plugs arrayed in parallel is set to be greater than that of the first contact plug(s).

17 Claims, 6 Drawing Sheets

MULTILAYER WIRING STRUCTURE FOR MEMORY CIRCUIT

CROSS-REFERENCE TO RELATED APPLICATION

This application is based on and claims the benefit of priority from the prior Japanese Patent Application No. 2007-186977, filed on Jul. 18, 2007, the entire contents of which are incorporated herein by reference.

BACKGROUND OF THE INVENTION

1. Field of the Invention

This invention relates to a semiconductor integrated circuit device with multilayered wirings.

2. Description of the Related Art

Recently, it is noticed that a resistance change memory device succeeds to the conventional flash memory. In the resistance change memory, the resistance value is reversibly exchanged by applying voltage, current or heat, and one of states with the different resistance values is stored as data. This resistance change memory is suitable for miniaturizing the cell size, and for constituting a cross-point cell array. In addition, it is easy to stack cell arrays.

There have already been proposed some three dimensional (3-D) cell array structures of this kind of memory devices. For example, refer to JP-A-2005-522045 (PCT/JP2003/000155) and JP-A-2006-514393 (PCT/JP2003/003257).

In case the cell array is three-dimensionally stacked, a multilayered metal wiring structure is used. In this case, how to equalize the wiring properties in the respective layers becomes material. For example, there have been proposed multi-layer wiring technologies such as: to make the CR time constant of the multilayered wirings constant (refer to JP-A-2004-146812); and to reduce the pad capacitance of the multilayered wirings in consideration of the number of via-wirings of the respective layers (refer to JP-A-2006-313824).

SUMMARY OF THE INVENTION

According to an aspect of the present invention, there is provided a semiconductor integrated circuit device including:

a semiconductor substrate, on which diffusion layers are formed; and multilayered wirings stacked above the semiconductor substrate to be connected to the diffusion layers via contact plugs, wherein a first wring and a second wiring formed thereabove are connected to the diffusion layers via first contact plug(s) and second contact plugs, respectively, and the number of the second contact plugs arrayed in parallel is set to be greater than that of the first contact plug(s).

According to another aspect of the present invention, there is provided a semiconductor integrated circuit device including:

a semiconductor substrate;

a plurality of cell arrays stacked on the semiconductor substrate, the cell arrays having memory cells arranged therein and multilayered wirings coupled to the memory cells; and contact plugs disposed at the respective ends of the multilayered wirings for connecting them with the semiconductor substrate, a certain number of contact plugs being arrayed in parallel underlying a certain wiring layer in such a manner that the number of the contact plugs arrayed in parallel is set to be greater as the wiring layer becomes upper.

DETAILED DESCRIPTION OF THE EMBODIMENTS

Illustrative embodiments of this invention will be explained with reference to the accompanying drawings below.

Figure 1:
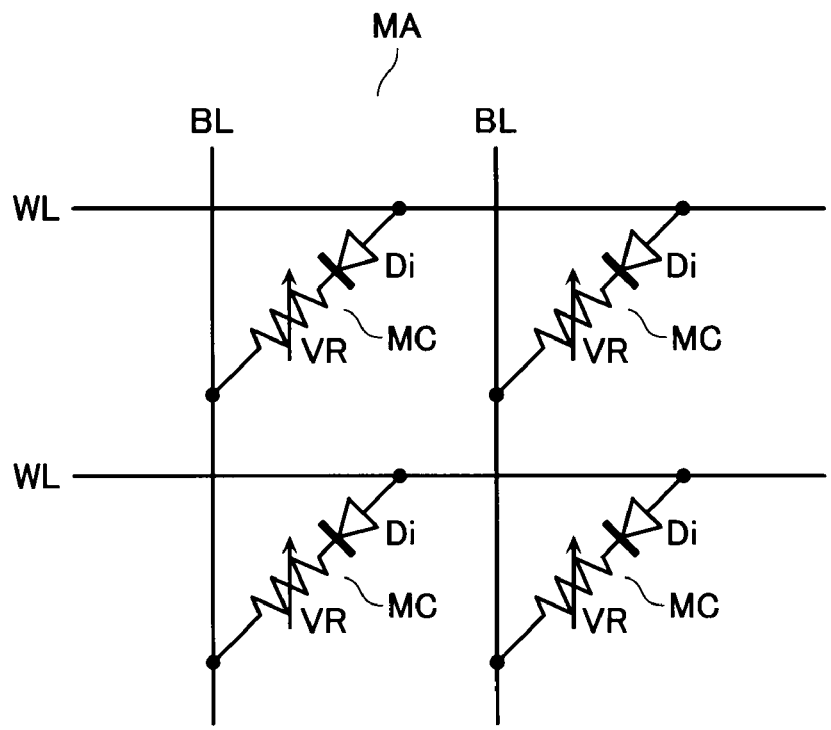
FIG. 1 is an equivalent circuit of a resistance change memory in accordance with an embodiment.

FIG. 1 shows an equivalent circuit of a cell array unit in accordance with an embodiment. As shown in FIG. 1, word lines WL and bit lines BL are arranged to cross each other, and memory cells MC of a resistance change type are disposed at the respective cross points of the word lines WL and bit lines BL.

Each memory cell MC is formed of variable resistance element VR and access-use diode D1 connected in series. The variable resistance element VR has, for example, a structure of electrode/transition metal oxide/electrode, and stores a resistance value state as data in a non-volatile manner, which is set with applying voltage, current or heat.

Data will be preferably defined in the memory cell as follows: one is a high resistance value state defined as a stable state (i.e., reset state); and another is a low resistance value state (i.e., set state). The detail will be explained later.

Figure 2:
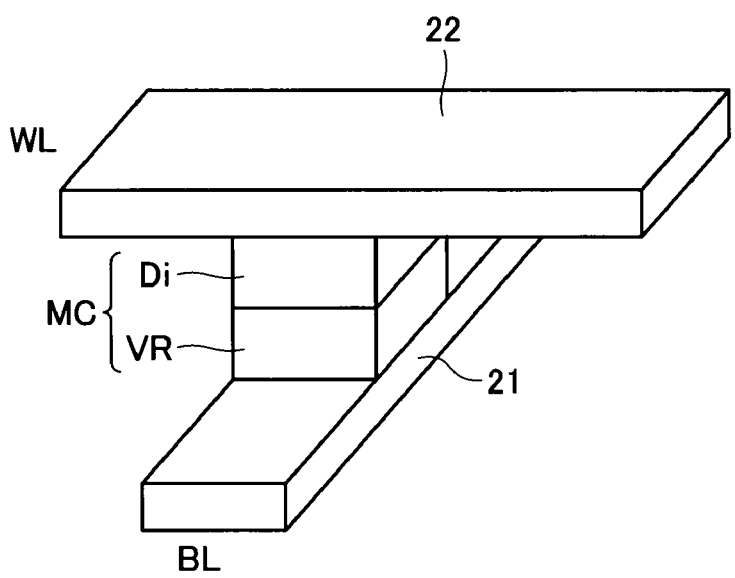
FIG. 2 shows the memory cell structure of the resistance change memory.

The stacked structure of a memory cell unit is shown in FIG. 2. Variable resistance element VR and access element Di are stacked at a cross point of metal wirings 21 and 22, which serve as bit line BL and word line WL, respectively.

Figure 3:
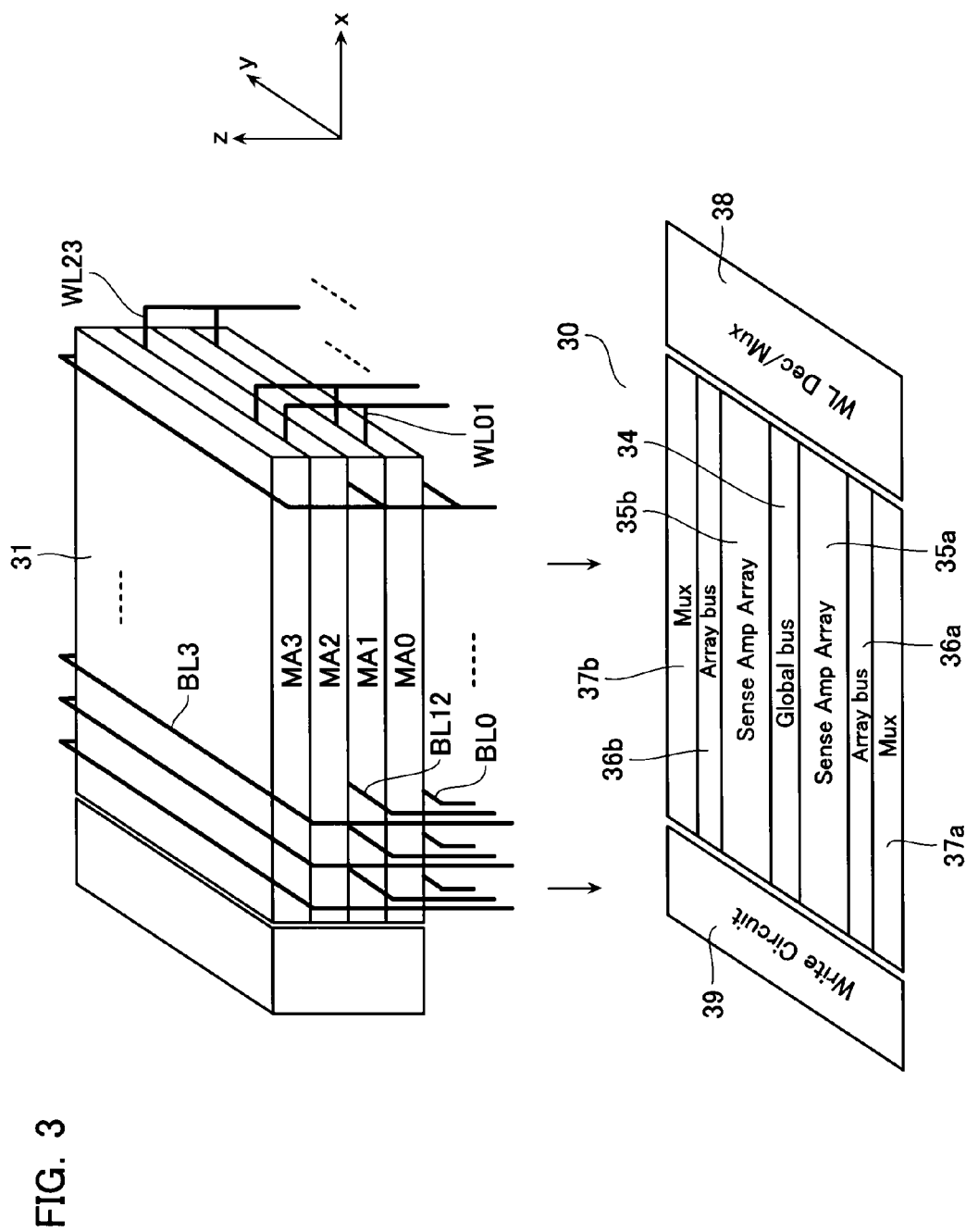
FIG. 3 shows the three-dimensionally stacked structure of the resistance change memory.

FIG. 3 shows schematically a state, in which memory cell arrays MA are three-dimensionally stacked. Here is shown a three-dimensionally stacked (i.e., 3D) cell array block 31, in which four cell arrays MA0 to MA3 are stacked. Here, BL0 is a bit line of cell array MA0; BL12 is a common bit line shared by adjacent cell arrays MA1 and MA2; and BL3 is that of cell array MA3.

Note here that if other cell arrays are stacked above and under these cell arrays, bit lines BL0 and BL3 also become common bit lines shared by adjacent two cell arrays.

WL01 is a common word line shared by adjacent cell arrays MA0 and MA1; and WL23 is a common word line shared by adjacent cell arrays MA2 and MA3. That is, bit lines BL run in y-direction while word lines WL run in x-direction perpendicular to y-direction.

A read/write circuit of this 3D cell array block 31 is formed on a semiconductor substrate 30, above which the 3D cell array are stacked. To constitute such a system that word lines and bit lines are selectively driven to select a cell at each cross point, it is in need of arranging vertical wirings (i.e. via-contacts) on three sides of the cell array block 31.

The circuit layout on the substrate 30 includes, for example, global bus 34 disposed in parallel with the word lines at the center portion of the shadow of 3D cell array block 31 for receiving/transmitting data between sense amplifier and the external; sense amplifier arrays 35*a* and 35*b* disposed to sandwich the global bus 34; and array buses 36*a* and 36*b* disposed outside the sense amplifier arrays 35*a* and 35*b* for transferring cell data to the sense amplifier arrays 35*a* and 35*b*.

Bit lines of the cell array block 31 are drawn out and connected to multiplexer circuits (MUXs) 37*a* and 37*b*, thereby being selected and connected to the array buses 36*a* and 36*b*.

Disposed at one end of the global bus 34 is word line decode circuit (i.e., row decoder) 38 for selecting word lines. Disposed at the other end is write circuit 39 for receiving/transmitting data between the sense amplifier and the external.

In FIG. 3, there is shown only one cell array block 31, in which plural cell arrays are stacked. However, it should be noted that multiple cell array blocks are arranged in the bit line BL direction (y-direction) in a practical memory device.

Figure 4:
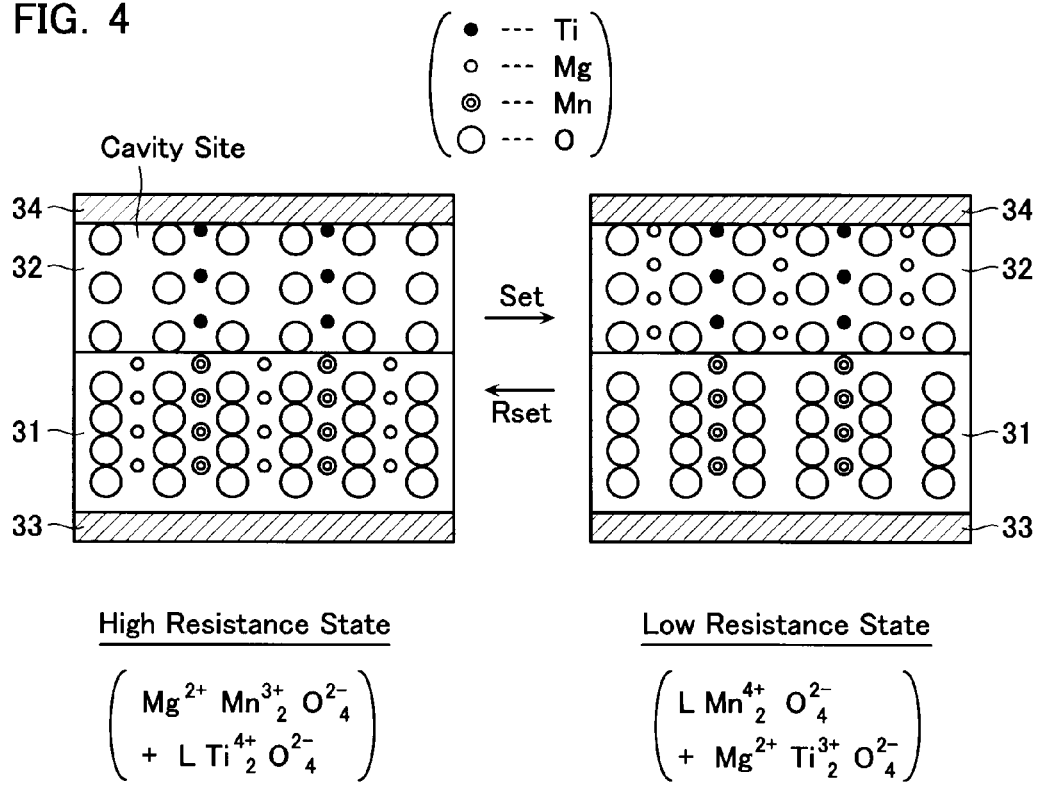
FIG. 4 is a diagram for explaining the dada storage principle of the variable resistance element in the resistance change memory.

FIG. 4 is a diagram for explaining the data storage mode of a variable resistance element VR. In this example, the variable resistance element VR has a stacked structure of first metal oxide layer 31 and second metal oxide layer 32, and electrodes 33 and 24 formed thereon.

Explaining in detail, the first metal oxide layer 31 is Mn-oxide containing Mg while the second metal oxide 32 is Ti-oxide having cavity sites. "L" shown in the compound expression in the drawing means a cavity site.

On the left side of FIG. 4, there is shown a high resistance value state. This is a stationary or stable state, in which the second metal oxide layer 32 has cavity sites. This state is defined as a reset state. Applying voltage to this element in such a manner that electrode 33 becomes positive, Mg ion in the first metal oxide layer 31 are drifted by the electric field and trapped in the cavity sites in the second metal oxide layer 32 as shown on the right side. As a result, a low resistance state, i.e., a set state, is obtained.

A reset process is a heat process. Applying voltage to the element, large current flows in the element because it is in the low resistance state, and Joule's heat is generated. This thermal energy releases Mg ion trapped in the cavity sites in the second metal oxide layer 32 to the first metal oxide layer 31, so that the high resistance state is restored.

Figure 5:
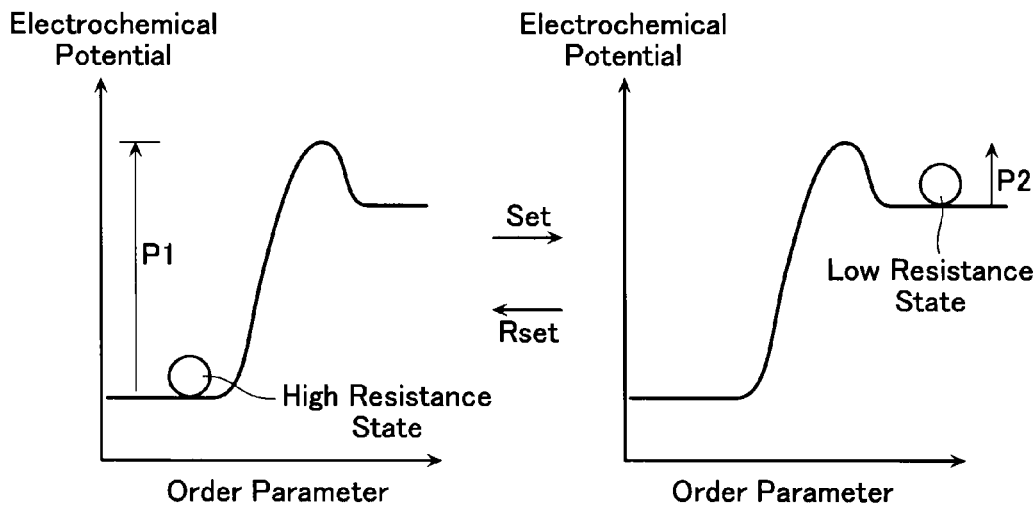
FIG. 5 shows the relationship between data and electrochemical potential distributions of the variable resistance element.

FIG. 5 shows electrochemical potential distributions of the variable resistance element, which are corresponds to the reset and set states, respectively, explained in FIG. 4. The reset state is defined as a stable state with a low electrochemical potential and as a high resistance state. If the electric field applied to the element is over potential barrier P2 shown in the drawing, the low resistance state may be set due to the metal (Mg) ion movement (reset operation).

On the other hand, if thermal energy applied to the element at the set state is over potential barrier P1 necessary to keep the set state, the element is restored to a thermally stabilized state, i.e., high resistance state (reset operation).

The variable resistance element VR is not limited to the example explained with reference to FIGS. 4 and 5. It should be noted that other device materials and device structures are adaptable.

What is required of the above-described 3D cell array structure is to have such multilayered wirings that the signal wirings in the respective layers have the same electric properties as each other. However, signal wirings on the upper layer side have in general a higher wiring resistance value than those on the lower layer side because the distance between the signal wirings and the diffusion layers formed on the substrate, to which the wirings are connected, becomes longer as the wiring is upper.

Specifically in case, as shown in FIG. 3, the bit lines in the respective layers are connected to the substrate circuit independently of each other, there is a possibility that the respective bit line properties become different from each other. This leads to obstruction for achieving a high speed read/write characteristic.

It is used in this embodiment such a multilayered wiring structure that makes the differences between wiring properties of the respective layers as less as possible. In detail, as described below, the numbers of via-contacts of the respective signal wirings are set to be optimum.

Figure 6:
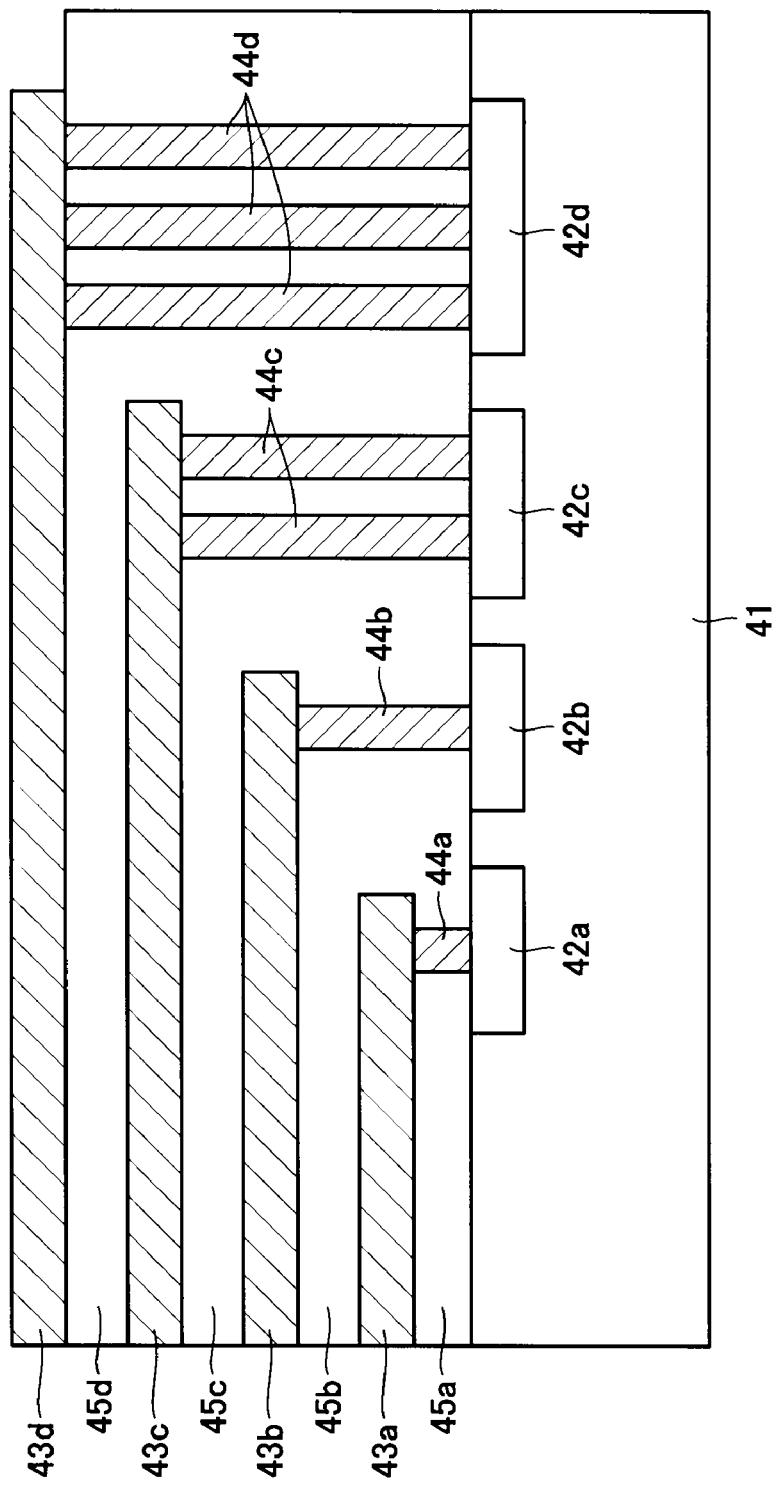
FIG. 6 shows a contact portion structure of multi-layer wirings of the resistance change memory.

FIG. 6 shows a sectional view at the via-contact portions where the respective ends of the multilayered metal wirings 43*a* to 43*d* are connected to the semiconductor substrate 41. The wirings 43*a* to 43*d* are, for example, the bit lines formed on the respective cell arrays 45*a* to 45*d*, in which resistance change memory cells are arranged as explained above. Alternatively, the wirings 43*a* to 43*d* are word lines of the respective cell arrays in such a scheme that the word lines are connected to the substrate independently of each other.

These signal wirings 43*a* to 43*b* are connected to the diffusion layers 42*a* to 42*d* serving as driver or receiver layers via contact plugs 44*a* to 44*d*, respectively. Note here that contact plugs 44*a* to 44*d* are buried in a process different from that of signal wiring 43*a* to 43*d* with different material layers or the same material layers as the signal wirings 43*a* to 43*d*, or buried simultaneously with the signal wirings 43*a* to 43*d* with the same material layers as the signal wirings 43*a* to 43*d*. These contact plugs will be simply referred to as "via-contacts", hereinafter.

The layout of the via-contacts will be explained in detail as follows: the first metal wiring 43*a* is connected to diffusion layer 42*a* through one via-contact 44*a*; the second metal wiring 43*b* is connected to diffusion layer 42*b* through one via-contact 44*b*; the third metal wiring 43*c* is connected to diffusion layer 42*c* through two via-contacts 44*c* arrayed in parallel; and the fourth metal wiring 43*d* is connected to diffusion layer 42*d* through three via-contacts 44*d* arrayed in parallel;

That is, while the number of the via-contacts of the second metal wiring is the same as that of the first metal wiring, the third metal wiring has more via-contacts than the first or second metal wiring; and the fourth metal wiring has further more via-contacts than the third metal wiring.

As explained above, as the metal wiring becomes upper, the number of via-contacts thereof is set to be greater. As a result, the contact resistance of the metal wiring of the upper layer side is suppressed, and properties of the metal wirings will be equalized in the respective layers.

In FIG. 6, the via-contacts of the first metal wiring and the second metal wiring are set at the same number as each other. This is a result in consideration of that the influence of the contact resistance on the wiring resistance is small as far as the second layer. It is effective that the number of via-contacts of the second metal wiring is set to be greater than that of the first metal wiring. Alternatively, it will also be adaptable that the successive two metal wiring layers has the same number of via-contacts, and as becoming upper, the number of via-contacts is increased.

Explaining in other words, the basic via-contact layout in this embodiment is in that taking notice a first wring and a second wiring formed there above, the number of contact plugs underlying the second wiring is set to be greater than that underlying the first wiring.

Figure 7:
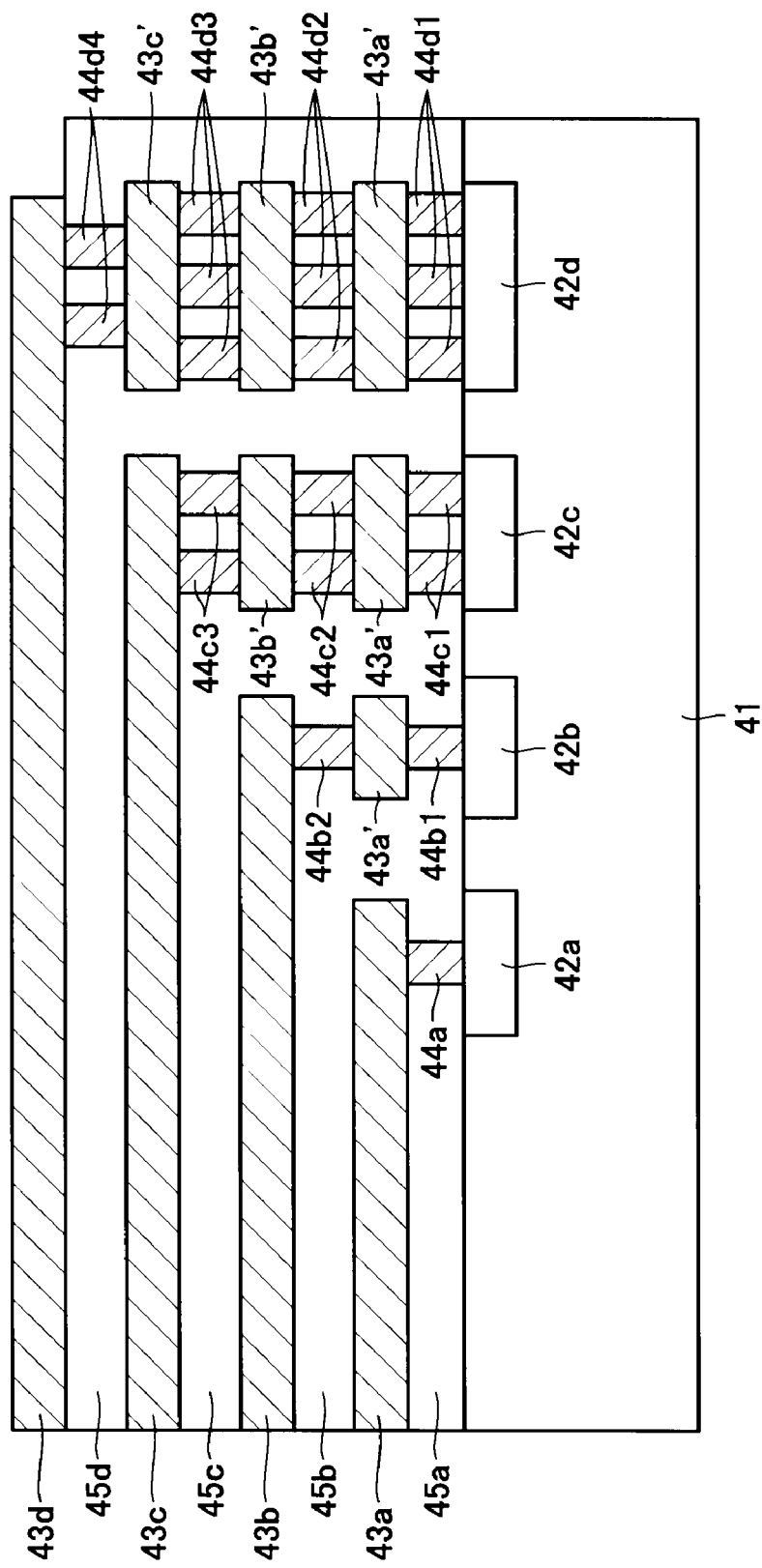
FIG. 7 shows the details of the contact portion structure.

FIG. 7 shows another via-contact structure, which is more practical than that shown in FIG. 6. In this example, relaying pads with the same material layers as the signal wirings are disposed between adjacent two contact plugs. Explaining in detail, with respect to the second wiring 43b, relaying pad 43a', which is formed of the same material layer as the first wiring 43a, is disposed to be connected to the diffusion layer 42b through via-contact 44b1; and the second wiring 43b is connected to the relaying pad 43a' through via-contact 44b2.

The third wiring 43c is connected to the substrate through relaying pads 43a' and 43b', which are formed of the same material layers as the first and second wirings 43a and 43b, respectively. The relaying pad 43a' is connected to the diffusion layer 42c through two via-contacts 44c1 arrayed in parallel; relaying pad 43b' is connected to the relaying pad 43a through two via-contacts 44c2 arrayed in parallel; and the third wiring 43c is connected to the relaying pad 43b' through two via-contacts 44c3 arrayed in parallel.

The third wiring 43c is connected to the substrate through relaying pads 43a' and 43b', which are formed of the same material layers as the first and second wirings 43a and 43b, respectively. The relaying pad 43a' is connected to the diffusion layer 42c through two via-contacts 44c1 arrayed in parallel; relaying pad 43b' is connected to the relaying pad 43a through two via-contacts 44c2 arrayed in parallel; and the third wiring 43c is connected to the relaying pad 43b' through two via-contacts 44c3 arrayed in parallel.

The fourth wiring 43d is connected to the substrate through relaying pads 43a', 43b' and 43c', which are formed of the same material layers as the first, second and third wirings 43a, 43b and 43c, respectively. That is, the first relaying pad 43a' is connected to the diffusion layer 42d through three via-contacts 44d1 arrayed in parallel; the second relaying pad 43b' is connected to the first relaying pad 43a' through three via-contacts 44d2 arrayed in parallel; the third relaying pad 43c' is connected to the second relaying pad 43b' through three via-contacts 44d3 arrayed in parallel; and the fourth wiring is connected to the third relaying pad 43c' through two via-contacts 44d4 arrayed in parallel.

Taking a view of plan view of this via-contact layout, the numbers of via-contacts are the same as those in the case of FIG. 6. That is, the first and second wirings each has one via-contact; the third wiring two via-contacts arrayed in parallel; and the fourth wiring three via-contacts arrayed in parallel. Therefore, the wiring properties are made to be uniform in the respective wirings.

In the example shown in FIG. 7, with respect to the fourth wiring 43d, there are prepared two via-contacts arrayed in parallel only for the uppermost set while there are three via-contacts for the remaining sets. This is a result of taking consideration CR time constant of the signal wiring. That is, assuming that a signal wiring is dealt with a CR distributed parameter circuit, which is formed with capacitances and resistances distributed from the edge of the diffusion layer, the resistances will affect CR time constant in such a manner that the nearer to the diffusion layer, the more the influences. In consideration of this point, there are prepared via-contacts 44d1 to 44d3 three by three underlying the relaying pads 43a' to 43c', respectively, while there are prepared two via-contacts 44d4 underlying the wiring 43d because the influence on the CR time constant is less than other wirings.

Generally explaining this point, with respect to wiring layers upper than a certain layer, the numbers of sets of via-contacts underlying the respective wiring layers are set as follows: as the wiring becomes near the diffusion layers, i.e., driver or receiver end, the number of the via-contacts is set to be greater. This is effective for making the CR time constant less.

Figure 8:
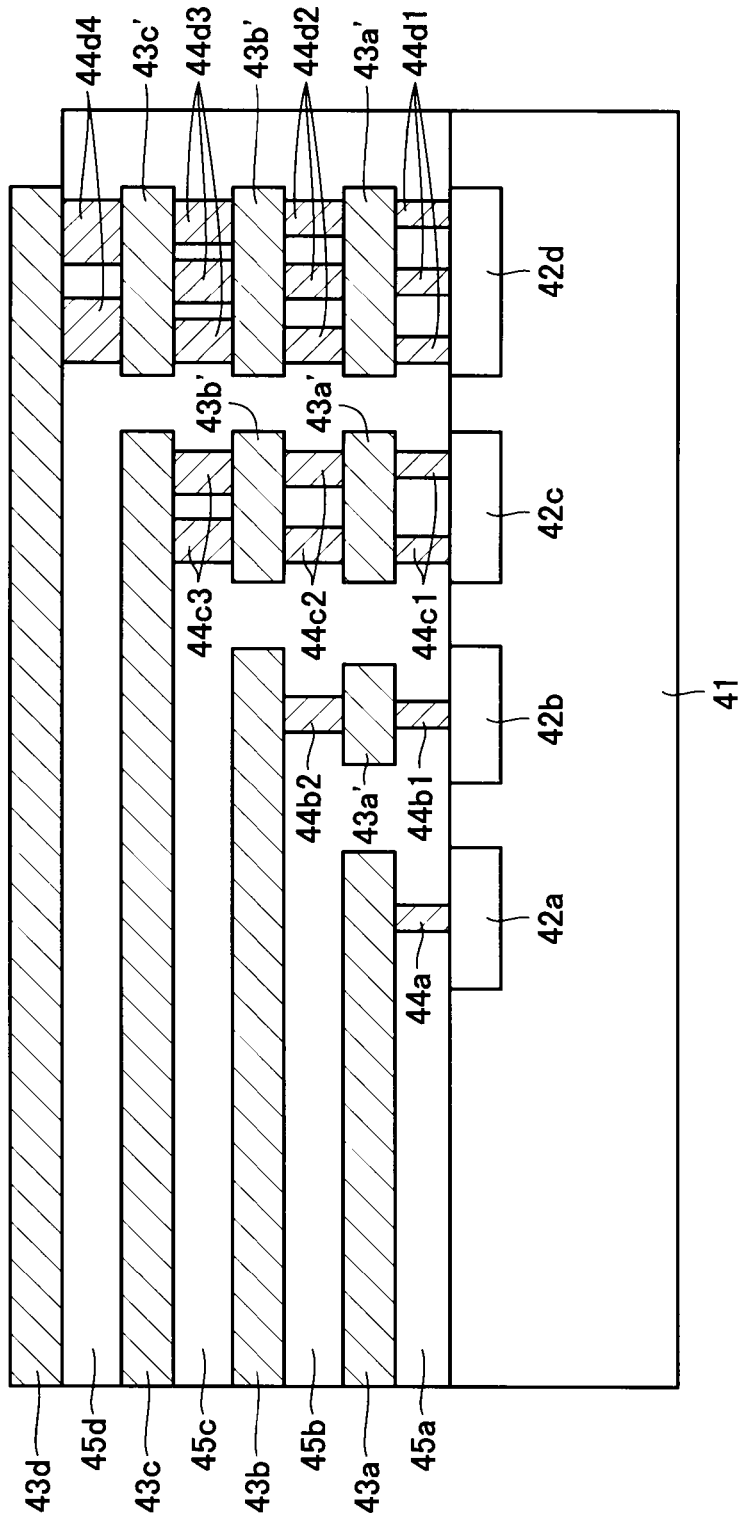
FIG. 8 shows a variation example of FIG. 7.

In the example shown in FIG. 7, it is assumed that the sets of via-contacts underlying the respective wiring layers have the same diameter (i.e., contact area) as each other. By contrast, it is permissible that the contact areas are set to be different from each other corresponding to the wiring layers. For example, FIG. 8 shows another example, which has the same basic via-contact structure as that shown in FIG. 7, and via-contact areas are set as follows: the lowest via-contact has the least contact area; the via-contact areas of the second and third layers are set to be greater that it; and the uppermost via-contact area is set to be further greater.

The multilayered wirings tend in general to that the upper, the thicker. Similarly, the via-contact diameters of the multilayered wirings tend to that the upper, the greater. The structure shown in FIG. 8 is adaptable to the current multilayered wiring process.

Taking notice of a detailed manufacturing process of the 3D cell array, for example, in the device process for forming the variable resistance element VR and diode D1, there is such a case that it is in need of heating the substrate up to 600° C.~800° C. for activating the diode. Therefore, it is desired to use high melting point metal such as tungsten (W).

To form a wiring and contact plug thereof simultaneously with a W film, it is desired, for example, to use a dual damascene method as follows: forming a wiring trench on an interlayer insulating film; further forming a contact hole in the trench; and then depositing a W film to be buried in these wiring trench and contact hole.

It is effective to use such a combination of wiring materials that the uppermost wiring is formed of a normal wiring material film such as a Cu or Al film; and other wirings, which are subjected to high temperature processes after film forming, are formed of high melting point metal films such as W films.

This invention is not limited to the above-described embodiment. For example, while it has been explained 3D resistance change memory device, it should be appreciated that this invention is adaptable to multi-layer wirings in many kinds of semiconductor integrated circuit devices such as memory devices of other types, logic circuits and the like. Further, it will be understood by those skilled in the art that various changes in form and detail may be made without departing from the spirit, scope, and teaching of the invention.

What is claimed is:

1. A semiconductor integrated circuit device comprising:
   a semiconductor substrate, on which conductive layers are formed;
   a first wiring layer formed above the semiconductor substrate to be electrically connected to a first conductive layer on the semiconductor substrate via one or more first via-contacts; and
   a second wiring layer formed above the first wiring layer to be electrically connected to a second conductive layer on the semiconductor substrate via plural sets of second via-contacts and relaying pads stacked alternately; and
   a plurality of wiring layers stacked in a direction perpendicular to the semiconductor substrate, each of the wiring layers being electrically connected to the conductive layers via plural sets of via-contacts and relaying pads stacked alternately,
   wherein a number of the second via-contacts constituting a set provided at a lowermost portion just above the second conductive layer is greater than that of the first via-contacts just above the first conductive layer, and wherein with respect to a certain wiring layer at the second layer or upper layer, the number of via-contacts constituting a set underlying a lower relaying pad near the semiconductor substrate is set to be greater than that of another set of via-contacts underlying an upper relaying pad.

2. The semiconductor integrated circuit device according to claim 1, further comprising:
a plurality of memory cell arrays stacked above the semiconductor substrate, wherein
the first wiring layer and the second wiring layer are word lines or bit lines of the memory cell arrays, one ends of which are connected to the conductive layers on the semiconductor substrate.

3. The semiconductor integrated circuit device according to claim 2, wherein
the memory cell array comprises memory cells of a resistance change type arranged therein.

4. The semiconductor integrated circuit device according to claim 1, further comprising:
a plurality of wiring layers stacked in a direction perpendicular to the semiconductor substrate, each of the wiring layers being electrically connected to the conductive layers via plural sets of via-contacts and relaying pads stacked alternately,
wherein the wiring layers are formed in such a manner that the number of the via-contacts constituting a set provided at a lowermost portion just above the conductive layers is greater for one of said wiring layers compared to that of an adjacent lower one of said wiring layers.

5. The semiconductor integrated circuit device according to claim 1, further comprising:
a plurality of wiring layers stacked in a direction perpendicular to the semiconductor substrate, each of the wiring layers being electrically connected to the conductive layers via plural sets of via-contacts and relaying pads stacked alternately,
wherein the sets of via-contacts are formed in such a manner that width of each of the via-contacts associated with one wiring layer is set to be wider compared to the via-contacts associated with an adjacent lower wiring layer.

6. The semiconductor integrated circuit device according to claim 1, wherein
a certain relaying pad is provided on the same level of the first wiring layer.

7. A semiconductor integrated circuit device comprising:
a semiconductor substrate;
a plurality of cell arrays stacked above the semiconductor substrate, the cell arrays having memory cells arranged therein and a plurality of wiring layers coupled to the memory cells; and
plural sets of via-contacts and relaying pads stacked alternately disposed at the respective ends of the wiring layers for connecting them with a conductive layer on the semiconductor substrate, the number of the via-contacts constituting a set provided at a lowermost portion just above the semiconductor substrate associated with one of the wiring layers being set greater compared to the number of the via-contacts associated with an adjacent lower wiring layer, wherein
with respect to a certain wiring layer at a second or upper layer, the number of via-contacts constituting a set underlying a lower relaying pad near the semiconductor substrate is set to be greater than that of another set of via-contacts underlying an upper relying relaying pad.

8. The semiconductor integrated circuit device according to claim 7, wherein
the wiring layers are word lines or bit lines of the cell arrays.

9. The semiconductor integrated circuit device according to claim 7, wherein
the memory cell is a resistance change type of memory cell.

10. The semiconductor integrated circuit device according to claim 7, wherein
the sets of via-contacts are formed in such a manner that width of each of the via-contacts associated with one wiring layer is set to be wider compared to the via-contacts associated with an adjacent lower wiring layer.

11. The semiconductor integrated circuit device according to claim 7, wherein
each of the relaying pads is provided on the same level as one of the wiring layers.

12. A semiconductor integrated circuit device comprising:
a semiconductor substrate, on which conductive layers are formed;
a first wiring layer formed above the semiconductor substrate to be electrically connected to a first conductive layer on the semiconductor substrate via one or more first via-contacts;
a second wiring layer formed above the first wiring layer to be electrically connected to a second conductive layer on the semiconductor substrate via one or more second via-contacts; and
a plurality of wiring layers stacked in a direction perpendicular to the semiconductor substrate, each of the wiring layers being electrically connected to the conductive layers via plural sets of via-contacts and relaying pads,
wherein a number of the second via-contacts just above the second conductive layer is set to be greater than that of the first via-contacts just above the first conductive layer, and
wherein with respect to a certain wiring layer at a second layer or upper layer, the number of via-contacts constituting a set underlying a low relaying pad near the semiconductor substrate is set to be greater than that of another set of via-contacts underlying an upper relaying pad.

13. The semiconductor integrated circuit device according to claim 12, further comprising:
a plurality of wiring layers stacked in a direction perpendicular to the semiconductor substrate, each of the wiring layers being electrically connected to the conductive layers via one or more via-contacts,
wherein the wiring layers are formed in such a manner that the number of the via-contacts just above the conductive layers associated with one wiring layer is set to be greater compared to the via-contacts associated with an adjacent lower wiring layer.

14. The semiconductor integrated circuit device according to claim 12, further comprising:
a plurality of memory cell arrays stacked above the semiconductor substrate, wherein
the first wiring layer and the second wiring layer are word lines or bit lines of the memory cell arrays, one ends of which are connected to the conductive layers on the semiconductor substrate.

15. The semiconductor integrated circuit device according to claim 14, wherein
the first wiring layer and the second wiring layer are metal wirings formed of high melting point metal films.

16. The semiconductor integrated circuit device according to claim 12, further comprising:

a plurality of wiring layers stacked in a direction perpendicular to the semiconductor substrate, each of the wiring layers being electrically connected to the conductive layers via plural sets of via-contacts and relaying pads, wherein the sets of via-contacts are formed in such a manner that width of each of the via-contacts associated with one wiring layer is set to be wider compared to the via-contacts associated with an adjacent lower wiring layer.

17. The semiconductor integrated circuit device according to claim 12, further comprising:

a plurality of wiring layers stacked in a direction perpendicular to the semiconductor substrate, each of the wiring layers being electrically connected to the conductive layers via plural sets of via-contacts and relaying pads, wherein each of the relaying pads is provided on the same level as one of the wiring layers.

\* \* \* \* \*